United States Patent
Kashiwagi et al.

(10) Patent No.: US 7,601,402 B2
(45) Date of Patent: Oct. 13, 2009

(54) METHOD FOR FORMING INSULATION FILM AND APPARATUS FOR FORMING INSULATION FILM

(75) Inventors: Yusaku Kashiwagi, Nirasaki (JP); Yoshihisa Kagawa, Nirasaki (JP); Kohei Kawamura, Nirasaki (JP); Gishi Chung, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 760 days.

(21) Appl. No.: 10/703,092

(22) Filed: Nov. 7, 2003

(65) Prior Publication Data

US 2004/0212114 A1 Oct. 28, 2004

(30) Foreign Application Priority Data

Nov. 8, 2002 (JP) .............................. 2002-325379

(51) Int. Cl.
*H05H 1/24* (2006.01)
(52) U.S. Cl. .................. 427/535; 427/577; 427/578; 427/249.15
(58) Field of Classification Search ............ 427/249.15, 427/577, 578, 535
See application file for complete search history.

(56) References Cited

U.S. PATENT DOCUMENTS

| | | | | |
|---|---|---|---|---|
| 5,314,724 A | * | 5/1994 | Tsukune et al. | 427/489 |
| 5,770,260 A | * | 6/1998 | Fukuyama et al. | 427/226 |
| 5,989,945 A | * | 11/1999 | Yudasaka et al. | 438/149 |
| 6,479,408 B2 | * | 11/2002 | Shioya et al. | 438/789 |
| 6,528,426 B1 | * | 3/2003 | Olsen et al. | 438/689 |
| 6,541,367 B1 | * | 4/2003 | Mandal | 438/622 |
| 6,558,756 B2 | * | 5/2003 | Sugahara et al. | 427/490 |
| 6,699,784 B2 | * | 3/2004 | Xia et al. | 438/637 |
| 6,777,325 B2 | * | 8/2004 | Ryuzaki et al. | 438/637 |
| 6,821,905 B2 | * | 11/2004 | Pan et al. | 438/706 |
| 7,265,038 B2 | * | 9/2007 | Wu et al. | 438/513 |
| 7,279,434 B2 | * | 10/2007 | Hata et al. | 438/778 |
| 2001/0051445 A1 | * | 12/2001 | Shioya et al. | 438/778 |
| 2004/0137243 A1 | * | 7/2004 | Gleason et al. | 428/447 |
| 2007/0158013 A1 | * | 7/2007 | Hyodo et al. | 156/77 |

(Continued)

FOREIGN PATENT DOCUMENTS

JP 07-029897 A 1/1995

(Continued)

OTHER PUBLICATIONS

Japanese Office Action (Notification of Reasons for Refusal) dated Aug. 15, 2006 including an English translation of the pertinent portions (Three (13) pages).

*Primary Examiner*—Bret Chen
(74) *Attorney, Agent, or Firm*—Crowell & Moring LLP

(57) ABSTRACT

A method for forming a porous insulating film includes an insulating film forming step and a hole forming step. During the insulating film forming step, plasma processing of an organic siloxane group compound and an organic compound having a polar group forms an insulating film having a siloxane structure. Molecules of the organic compound having a polar group are contained within this siloxane structure. During the hole forming step, excitation gas removes molecules of the organic compound having a polar group to provide holes in the insulating film. According to this method, an insulating film with a predetermined thickness and holes formed uniformly in the thickness direction can be obtained.

13 Claims, 3 Drawing Sheets

U.S. PATENT DOCUMENTS

2007/0161257 A1 * 7/2007 Hyodo et al. ............... 438/780

FOREIGN PATENT DOCUMENTS

| | | | |
|---|---|---|---|
| JP | 10340899 A | 12/1998 | |
| JP | 11-176829 A | 7/1999 | |
| JP | 2000-216153 | * | 8/2000 |
| JP | 2000-216153 A | | 8/2000 |
| JP | 2000277507 A | | 10/2000 |
| JP | 2002-134494 A | | 5/2002 |
| WO | WO 2007/061134 A1 | * | 5/2007 |

* cited by examiner

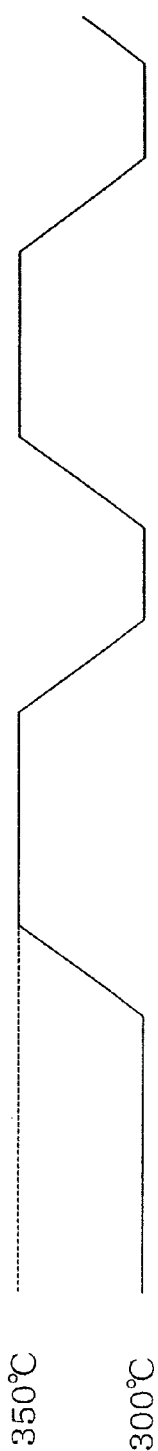
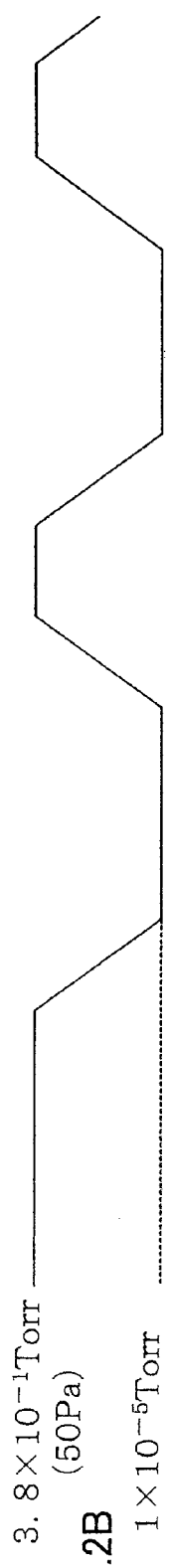
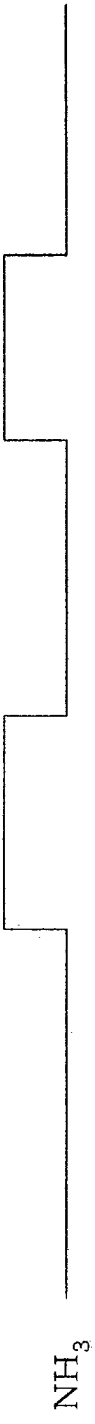
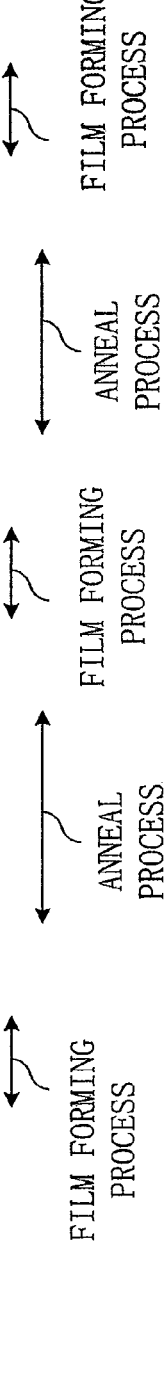
FIG.2A 350°C 300°C
FIG.2B $3.8 \times 10^{-1}$ Torr (50Pa) $1 \times 10^{-5}$ Torr ($1.33 \times 10^{-3}$ Pa)
FIG.2C V3D3, IPA
FIG.2D Ar
FIG.2E $NH_3$
FIG.2F HIGH FREQUENCY POWER
FIG.2G FILM FORMING PROCESS — ANNEAL PROCESS — FILM FORMING PROCESS — ANNEAL PROCESS — FILM FORMING PROCESS

IN-SITU TYPE

EX-SITU TYPE

METHOD FOR FORMING INSULATION FILM AND APPARATUS FOR FORMING INSULATION FILM

BACKGROUND OF THE INVENTION

1. Field of the Invention

The present invention relates to an insulating film forming method and its apparatus, and particularly relates to a method for forming a low dielectric insulating film with holes and its apparatus.

2. Description of the Related Art

Against the background of the demand for the high-speed performance and miniaturization of the semiconductor device, the multilayering of the semiconductor device and the wire fining have been developed. However, there is a problem in that a signal propagation velocity becomes low in accordance with the multilayering of the semiconductor device and the wire fining. For example, in the design rule with 0.15 μm or less, there is a possibility that the propagation velocity at which the signal travels through the wire having a multilayer structure will decrease to make it impossible to attain a desired high-speed performance. In order to prevent an increase in a signal delay caused by this fining, it is useful to constrain the dielectric constant of an interlayer insulating film of the wire to be low.

For this reason, the use of various kinds of insulating film forming materials was conventionally reviewed. Among them, attention has been paid to insulating films with a high porosity using a property in which a dielectric constant as a film becomes lower than a dielectric constant native to the material when holes exist in the film.

As the method for forming the insulating film with holes, for example, Unexamined Japanese Patent Publication 2000-277507 and Unexamined Japanese Patent Publication H10-340899 disclose a method in which an insulating film containing a hydrocarbon and the like is formed by, for example, CVD (Chemical Vapor Deposition) and low boiling point ingredients are removed to form holes in an insulating film.

In treatment after forming the insulating film, for example, a heat treatment that heats a substrate on which the insulating film is formed at high temperature. However, the practical insulating film has a relatively high thickness of about 500 nm to 700 nm (about 5000 Å to 7000 Å). For this reason, a temperature gradient is caused in a thickness direction of the insulating film. There was a problem in that the temperature gradient caused deviations in a hole size and a film density from the surface of the insulating film to its interior, making it difficult to form an insulating film with an uniform film characteristic. Moreover, there was a case in which an area with a small porosity was left in the part of the insulating film, so that the dielectric constant of the insulating film did not sufficiently decrease.

SUMMARY OF THE INVENTION

The present invention has been made in consideration of the aforementioned circumstances, and an object of the present invention is to provide an insulating film forming method and insulating film forming apparatus that are capable of forming holes uniformly in a thickness direction of an insulating film.

Moreover, another object of the present invention is to provide an insulating film forming method and insulating film forming apparatus that are capable of forming a film with a high porosity.

Still moreover, another object of the present invention is to provide an insulating film forming method and insulating film forming apparatus for forming an insulating film with homogeneity and a small dielectric constant.

In order to attain the above object, an insulating film forming method according to a first aspect of the present invention includes an insulating film forming step of forming an insulating film formed in such a manner that predetermined organic compound molecules are captured in the structure of a silicon compound. The method further includes an anneal step of annealing the insulating film such that the organic compound molecules in the insulating film formed in the insulating film forming step are selectively desorbed. The insulating film forming step and the anneal step may be repeatedly performed alternately to form an insulating film with a predetermined thickness.

According to this method, there is formed an insulating film formed in such a manner that predetermined organic compound molecules are captured in the structure of a silicon compound. In the anneal step, the thickness of the insulating film to be formed can be set such that the organic compound molecules are desorbed from the insulating film to form uniform holes in a thickness direction. Accordingly, the insulating film forming step and the anneal step are repeatedly performed by a plurality of times, thereby making it possible to form an insulating film with a desired thickness and a uniform film characteristic.

The insulating film can be exposed to excitation gas in the anneal step.

It is desirable that the excitation gas be comprised of any one of a reactive gas, an oxidizing gas, a reducing gas, an inert gas or plasma of mixture gas of these gases.

It is desirable that the silicon compound be an organic siloxane compound.

The insulating film can be formed to have such a thickness in a range where the excitation gas can penetrate in the insulating film forming step. It is desirable that the thickness range from 1 nm to 100 nm.

In order to attain the above object, an insulating film forming apparatus according to a second aspect of the present invention includes an insulating film forming chamber for forming an insulating film on a processing object where the insulating film is formed in such a manner that predetermined organic compound molecules are captured in the structure of a silicon compound. The apparatus further includes an annealing chamber for annealing the processing object such that the organic compound molecules in the insulating film formed in the insulating film forming chamber are selectively desorbed. The apparatus further include a transfer device that repeatedly performs transferring between the insulating film forming chamber and the annealing chamber alternately to form an insulating film with a predetermined thickness.

BRIEF DESCRIPTION OF THE DRAWINGS

These objects and other objects and advantages of the present invention will become more apparent upon reading of the following detailed description and the accompanying drawings in which:

FIGS. 2A to 2G are timing diagrams of an insulating film forming method according to an embodiment of the present invention;

FIG. 2A shows temperature in a chamber;

FIG. 2B shows a change in pressure in a chamber;

FIG. 2C shows start and stop timing for supplying V3D3 and IPA into a chamber;

FIG. 2D shows start and stop timing for supplying Ar into a chamber;

FIG. 2E shows start and stop timing for supplying NH$_3$ into a chamber;

FIG. 2F shows start and stop timing for supplying high frequency power into a chamber;

FIG. 2G is a diagram explaining the contents of treatment; and

DETAILED DESCRIPTION OF THE PREFERRED EMBODIMENT

An insulating film forming method according to an embodiment of the present invention will be explained with reference to the drawings. According to the insulating film forming method according to an embodiment of the present invention, an insulating film (hereinafter referred to SiOC film) being formed of silicon (Si), oxygen (O), carbon (C) as ingredients and having uniform holes in a thickness direction, is formed.

Figure 1:
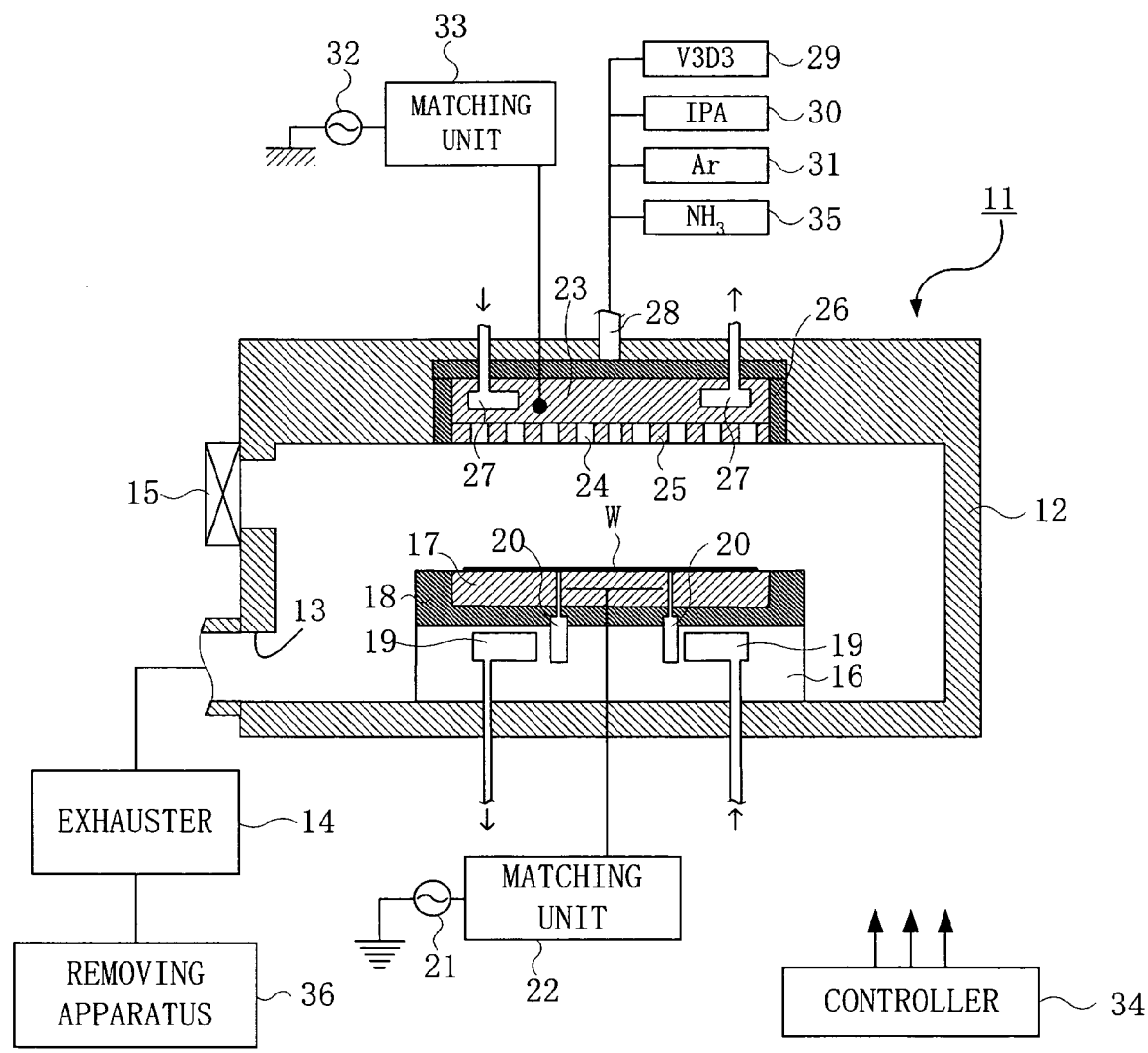
FIG. 1 is a view illustrating the structure of a treating apparatus according to an embodiment of the present invention.

FIG. 1 illustrates a structural example of an apparatus for implementing an insulating film forming method according to the present embodiment.

A treating apparatus 11 of the present embodiment includes a so-called parallel plane type plasma CVD apparatus having electrodes opposite to each other in parallel up and down. The treating apparatus 11 forms an SiOC film on a surface of a semiconductor wafer (hereinafter called wafer W) by CVD.

The treating apparatus 11 has a cylindrical chamber 12. The chamber 12 is formed of conductive material such as aluminum subjected to alumite treatment (anodic oxidation treatment) and the like. Moreover, the chamber 12 is grounded.

An exhaust port 13 is provided on a bottom portion of the chamber 12. An exhauster 14 including a vacuum pump such as a turbo molecular pump is connected to the exhaust port 13. The exhauster 14 exhausts the chamber 12 up to a predetermined pressure. Moreover, a gate valve 15 is provided on a side wall of the chamber 12. Wafer W is loaded and unloaded between the chamber 12 and the exterior thereof with the gate valve 15 opened.

A removing apparatus 36 is an apparatus that renders an ambient gas in the chamber 12 exhausted by the exhauster 14 harmless. The removing apparatus 36 burns or thermally decomposes the ambient gas by a predetermined catalyst to convert into harmless matter.

A substantially cylindrical susceptor support base 16 is provided on the bottom portion of the chamber 12. On the susceptor support base 16, a susceptor 17 is provided as a wafer W mounting table. The susceptor 17 has a function as a lower electrode and a portion between the susceptor support base 16 and the susceptor 17 is insulated by an insulating material 18 such as ceramics.

A lower coolant passage 19 is provided in the susceptor support base 16. Coolant circulates in the lower coolant passage 19. The coolant circulates in the lower coolant passage 19, and the susceptor 17 and wafer W are thereby controlled at a desired temperature.

The susceptor support base 16 is provided with lift pins 20 for delivering the semiconductor wafer W, and the lift pins 20 is movable up and down by a cylinder (not shown). Moreover, a convex disk-like central portion is formed on the susceptor 17, and an electrostatic chuck (not shown) that has a substantially same shape as the wafer W is formed thereon. The wafer W mounted on the susceptor 17 is electrostatically adsorbed by applying direct voltage thereto.

A first high frequency power source 21 is connected to the susceptor 17 functioning as the lower electrode via a first matching unit 22. The first high frequency power source 21 has a frequency ranging from 0.1 to 5 MHz. The frequency with the aforementioned range is applied to the first high frequency power source 21, thereby obtaining an effect such as a reduction in damage to a processing object.

At the upper portion of the susceptor 17, a shower head 23 is provided to be opposite to the susceptor 17 in parallel therewith. An electrode plate 25 formed of aluminum and the like is provided on a surface of the shower head 23 opposing to the susceptor 17. The electrode plate 25 has numerous gas holes 24. The shower head 23 is supported at a ceiling portion of the chamber 12 by an electrode support 26. In the shower head 23, an upper coolant passage 27 is provided. Coolant circulates in the upper coolant passage 27 and the shower head 23 is controlled at a desired temperature.

A gas introduction pipe 28 is connected to the shower head 23. The gas introduction pipe 28 is connected to a gas source 29 for 1,3,5-trimethyl-1,3,5-trivinylcyclotrisiloxane (V3D3), a gas source 30 for isopropyl alcohol (IPA) and a gas source 31 for argon (Ar) via a mass flow controller, a valve and the like (not shown). Since both V3D3 and IPA are liquid at room temperature, they are supplied to the gas sources 29 and 30 in a state that they are vaporized by a heating section (not shown). Moreover, a gas source 35 for NH$_3$, that is a process gas for forming holes, is also connected to the gas introduction pipe 28 via the mass flow controller, the valve and the like (not shown).

Raw gas and process gas from the gas sources 29 to 31 and 35 are mixed and supplied to a hollow section (not shown) formed in the shower head 23 through the gas introduction pipe 28. Gases supplied to the shower head 23 are spread in the hollow section and supplied to the surface of the wafer W from the gas holes 24 of the shower head 23.

A second high frequency power source 32 is connected to the shower head 23, and a matching unit 33 is provided therebetween through the feeder. The second high frequency power source 32 has a frequency ranging from 13 to 150 MHz, and a high frequency is thus applied, so that the shower head 23 functions as the upper electrode to form plasma with a high density in a favorable dissociation state in the chamber 12.

A controller 34 controls the entire operation of the treating apparatus 11 including a film forming process onto the wafer W. The controller 34 is a microcomputer control device having an MPU (Micro Processing Unit), a memory and the like. The controller 34 stores a program for controlling the respective apparatus sections according to a predetermined treatment sequence in the memory, and transmits a control signal to the respective apparatus sections according to the program.

The following will explain the insulating film forming method using the aforementioned treating apparatus 11. FIGS. 2A to 2G are timing diagrams of an insulating film forming method according to an embodiment of the present invention. The timing diagrams illustrated in FIGS. 2A to 2G are one example, and any structure may be possible if the same effect can be attained.

First of all, an unprocessed wafer W which is held by a transfer arm (not shown) is loaded into the chamber 12 through the gate valve 15 that stays opened. The transfer arm delivers the wafer W to the lift pins 20 placed at an upward position and withdraws from the chamber 12. After that, the wafer W is mounted on the susceptor 17 by the descent of the lift pins 20. The wafer W is fixed onto the susceptor 17 by the electrostatic chuck.

Next, the controller 34 sets the interior of the chamber 12 to, for example, 50 Pa ($3.8 \times 10^{-1}$ Torr) using the exhauster 14 as illustrated in FIG. 2B. At the same time, the controller 34 sets temperature of the susceptor 17 to temperature of 400° C. or less, for example, 300° C. as illustrated in FIG. 2A.

Thereafter, as illustrated in FIGS. 2C and 2D, V3D3, IPA and Ar gases are supplied into the chamber 12 from the gas sources 29 to 31 at a predetermined flow rate. The mixture gas of process gases is uniformly discharged to the wafer W from the gas holes 24 of the shower head 23. For example, V3D3, IPA and Ar are supplied at a flow rate of V3D3/IPA/Ar=30/10/100 (each sccm).

Then, as illustrated in FIG. 2F, high frequency power of, for example, 27 MHz is applied to the upper electrode (shower head 23) from the second high frequency power source 32. This causes a high frequency electric field between the upper electrode and the lower electrode (susceptor 17) to generate plasma of mixture gas. While, high frequency power of, for example, 2 MHz is applied to the lower electrode from the first high frequency power source 21. As a result, charged particles in the generated plasma, particularly, molecular active species of V3D3 and IPA are attracted to a portion close to the surface of the wafer W to cause reaction, so that an SiOC film containing IPA molecules is formed on the wafer W.

The controller 34 applies high frequency power onto the upper and lower electrodes 23 and 17 for a few seconds to several tens of seconds to form an SiOC film with a thickness of, for example, 50 nm (500 Å) on the surface of the wafer W as illustrated in FIG. 2G. After a predetermined time since the start of application of high frequency power, the controller 34 stops application of high frequency power onto the upper and lower electrodes as illustrated in FIG. 2F and stops introduction of V3D3 and IPA from the V3D3 gas source 29 and the IPA gas source 30 as illustrated in FIG. 2C. Accordingly, the film forming process once ends. At this time, Ar is made to flow into the chamber 12 as illustrated in FIG. 2D.

The controller 34 purges the chamber 12 with Ar gas for a predetermined time to remove the residual V3D3 and IPA from the chamber 12. At this time, the controller 34 sets temperature of the susceptor 17 to temperature of 450° C. or less, for example, 350° C. as illustrated in FIG. 2A. Moreover, the controller 34 sets pressure to, for example, $1.3 \times 10^{-3}$ Pa ($1 \times 10^{-5}$ Torr) as illustrated in FIG. 2B.

Thereafter, $NH_3$ and Ar gases are supplied into the chamber 12 from the gas sources 35 and 31 at a predetermined flow rate as illustrated in FIGS. 2D and 2E. The $NH_3$ and Ar gases are uniformly discharged to the wafer W from the gas holes 24 of the shower head 23. For example, supply of $NH_3$ and Ar gases is performed at a flow rate of $NH_3$/Ar=30/100 (each sccm).

Next, high frequency power of, for example, 40 MHz is applied to the upper electrode (shower head 23) from the second high frequency power source 32 as illustrated in FIG. 2F. This causes a high frequency electric field between the upper electrode and the lower electrode (susceptor 17) to generate plasma of $NH_3$ gas. While, high frequency power of, for example, 2 MHz is applied to the lower electrode from the first high frequency power source 21. As a result, active species in the generated plasma are attracted to the susceptor 17, so that plasma density close to the surface of the wafer W becomes high. Thus, application of high frequency power onto the upper and lower electrodes 23 and 27 generates plasma of $NH_3$ gas, and a chemical reaction on the surface of the wafer W caused by the plasma removes IPA molecules from the SiOC film. The controller 34 performs the plasma treatment for a predetermined time to form a film with a predetermined porosity.

Here, the depth of penetration (spread) of plasma-converted $NH_3$ into the insulating film in the thickness direction is about 100 nm (1000 Å). While, the thickness of the insulating film formed in the film forming process is 50 nm (500 Å). For this reason, since the active species of $NH_3$ gas are sufficiently spread to the interior from the surface of the insulating film to allow the combination of a siloxane structure and IPA molecules to be dissociated, holes are uniformly formed in the insulating film in the thickness direction. Not only IPA molecules but also its decomposition product is, of course, removed.

The exhauster 14 discharges desorbed IPA molecules and the process gas to the exterior of the chamber 12 as an exhaust gas.

After a predetermined time, the controller 34 reduces temperature of the susceptor 17 to temperature (300° C.) at the film forming time and sets pressure to 50 Pa ($3.8 \times 10^{-1}$ Torr) as making Ar to flow into the chamber 12, as illustrated in FIGS. 2A, 2B, and 2D.

Thereafter, the controller 34 starts to form the aforementioned thin film of SiOC again. Namely, the controller 34 starts the supply of V3D3 and IPA from the gas sources. Next, the controller 34 applies high frequency power to the upper electrode and the lower electrode. The film forming process is performed for a predetermined time in the same way as the above, so that a thin film of SiOC with a thickness of 50 nm is newly formed on the formed thin film.

After the film forming process, the control section 34 stops application of high frequency power onto the upper and lower electrodes, and stops supply of V3D3 and IPA. Then, the controller 34 sets temperature of the susceptor 17 to temperature of 350° C. and pressure of the chamber 12 to $1.3 \times 10^{-3}$ Pa ($1 \times 10^{-5}$ Torr) and purges the chamber 12 with Ar gas.

The controller 34 introduces $NH_3$ gas as the process gas into the chamber 12 again, and maintains the susceptor 17 at 350° C. to perform plasma annealing. This desorbs the IPA molecules in the SiOC film, particularly, a newly formed film. In this way, the hole forming process is performed to the newly formed SiOC film.

After that, the controller 34 reduces temperature of the susceptor 17 to 300° C., and sets pressure of the chamber 12 to 50 Pa ($3.8 \times 10^{-1}$ Torr). The controller 34 thus repeats the film forming process, plasma annealing and purging between the respective processes. The controller 34 repeats the aforementioned processes by the number of times by which the thickness of the entire SiOC film on which the thin film is layered reaches a predetermined value, for example, 500 nm (5000 Å).

After repeating the aforementioned processes (film forming process and anneal process) by a predetermined number of times as illustrated in FIG. 2G, the controller 34 stops heating the susceptor 17 and returns the pressure of the chamber 12 to a degree corresponding to the external pressure of the chamber 12. Thereafter, the electrostatic chuck is released and the lift pins 20 move up. Next, the gate valve 15 is opened, so that the transfer arm enters the chamber 12. The wafer W is unloaded to the outside of the chamber 12 by the transfer arm.

As explained above, according to the present embodiment, V3D3 and IPA are used as starting materials and a thin insulating film of SiOC containing IPA molecules in the siloxane structure and having a thickness of, for example, 50 nm is formed by plasma CVD as illustrated in FIG. 2G. Next, plasma annealing is performed to the thin film by $NH_3$ plasma. At this time, the active species in the plasma sufficiently penetrates into the interior from the surface of the thin film, making it possible to desorb IPA molecules captured in the siloxane structure. For this reason, holes are uniformly formed in the thin film in the thickness direction. In this way, the thin film forming process and the hole forming process are alternately repeated, thereby enabling to form an insulating film having a desired thickness and holes uniformly in the thickness direction. This makes it possible to form a film with a low dielectric constant.

The present invention is not limited to the aforementioned embodiment, and various modifications and applications may be possible.

In the aforementioned embodiment, the SiOC film as the insulating film was formed using V3D3 and IPA as row material compounds. However, the insulating film of the present invention is not limited to the SiOC film. An insulating film having the structure of SiC, SiN, SiCN, SiOF, or SiOx may be possible. Moreover, in place of V3D3, cyclosiloxane compounds such as octamethylcyclotetrasiloxane (D4), hexaethylcyclotrisiloxane, hexamethylcyclotrisiloxane, octaphenylcyclotrisiloxane, tetraethylcyclotrisiloxane, and the like can be used as materials to form the SiOC film, however, the present invention is not limited to these.

Moreover, IPA was used as an organic compound that reacted with the silicon compound to form an insulating film. However, derivatives of a straight-chain alkyl alcohol having an OH group that is a polar group, cyclic alkyl alcohol, aromatic alcohol, and various kinds of ketones, various kinds of ethers and the like may be used. Furthermore, materials that are easily pulled out of the molecular structure that forms the insulating film by a process gas such as $NH_3$ in the hole forming process after forming the insulating film may be used. For example, such compounds that have various kinds of polar groups such as an OH group, a COOH group is contained in the molecules. However, the present invention is not limited to these.

In the aforementioned embodiment, $NH_3$ was used as the process gas to form the holes in the thin insulating film formed in the hole forming process. In addition to this, reducing and oxidizing gases such as $H_2$, $N_2$, $O_2$, He and the like and an inert gas can be used. Any gas may be possible if the corresponding gas can sufficiently penetrate into the insulating film and organic molecules existing in the insulating film can be efficiently desorbed. Furthermore, reactive gases such as silane gas such as $SiH_4$, hydrocarbon gas such as $CH_4$, fluorocarbon gas such as $C_4F_8$ and the like can be used. These gases may be singly used or they may be used by mixing with the aforementioned reducing gas or oxidizing gas or inert gas. In this case, both the hole forming and the thin film reforming can be performed.

Moreover, in the film forming process, the thin SiOC film with a thickness of 50 nm was formed. However, the thickness of the thin film is not limited to this. Any thickness may be possible if it is such a thickness in a range where the active species of the process gas used in the plasma anneal process, which is a post process, can penetrate into the thin film uniformly as to uniformly form holes in the thickness direction. The thickness of the thin film is favorably in a range that the number of atomic layers is one or more and the using process gas can penetrate. For example, in a case where $H_2$ is used as the process gas, since the depth of penetration of active species of $H_2$ is about 100 nm (1000 Å), the thin film may be formed to have a thickness of 50 to 100 nm. Similarly, in a case where $O_2$ is used as the process gas, since the depth of penetration of active species of $O_2$ is about 5 to 10 nm (about 50 Å to 100 Å), the thin film may be formed to have a thickness of about 2.5 nm to 10 nm. In this way, the thickness of the thin film that the holes can be uniformly formed in the thickness direction can be set based on the depth of penetration of active species of the process gas to be used.

In the aforementioned embodiment, the parallel plane type plasma CVD apparatus was used in the film forming process. However, the present invention is not limited to this, and plasma processes of ECR type, ICP type, TCP type, helicon type and the like may be used. Furthermore, the present invention may use a thermal CVD or an optical CVD without limiting to the plasma CVD.

In the aforementioned embodiment, $NH_3$ was used as the process gas to perform the plasma annealing process in the hole forming process for desorbing IPA molecules. However, the method for desorbing the IPA molecules is not limited to this. For example, this can be performed by selectively dissociating the combination of IPA molecules and V3D3 molecules introduced in the film forming process by the heating (anneal process) under a reduced pressure. Moreover, a thermal radical of the aforementioned process gas such as $H_2$, $O_2$, $CH_4$, $SiF_4$ and the like can be generated by an excitation source such as an electron beam and the like, and this thermal radical can make it possible to pull out IPA molecules in the insulating film to desorb.

The aforementioned embodiment explained that the high frequency power with a predetermined frequency was applied to the upper electrode and the lower electrode. However, the frequency of the high frequency power to be applied is not limited to this.

Figure 3A:
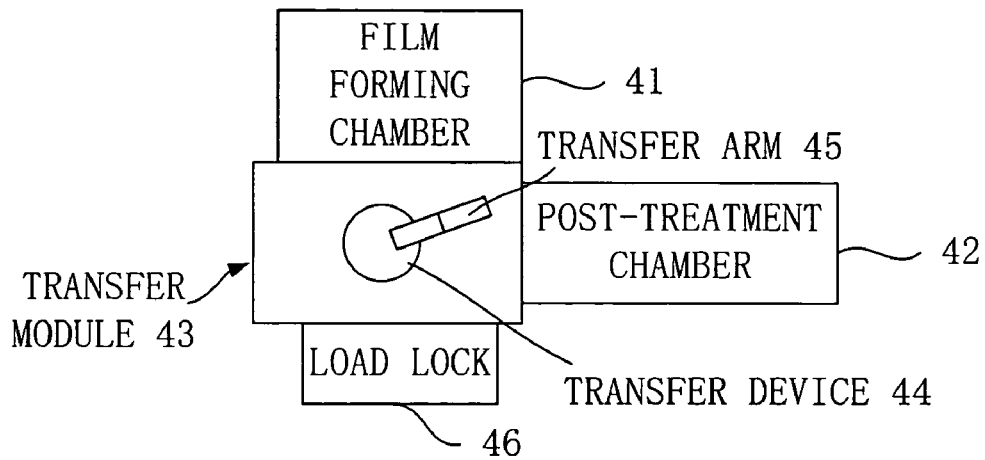
FIGS. 3A and 3B are schematic views each illustrating a modification of an insulating film forming apparatus according to an embodiment of the present invention.
Figure 3B:
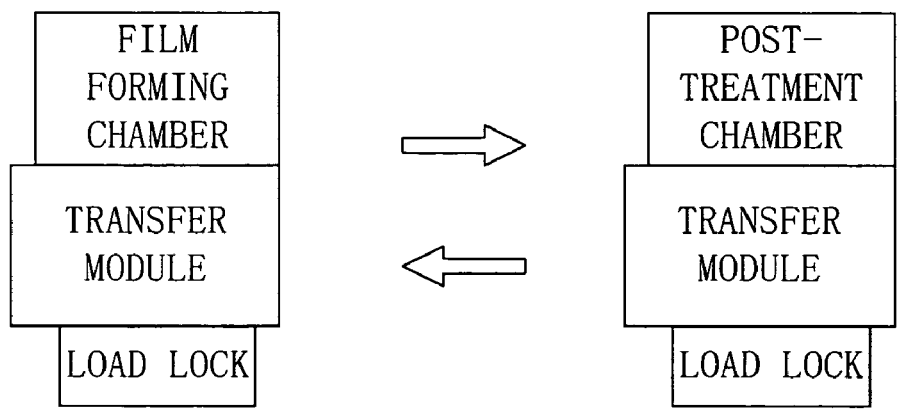

The hole forming process was performed using the same chamber 12 as one used in the film forming process. However, this may be executed, using another chamber where the aforementioned process can be performed, by the treating apparatus 11 sequentially with the film forming process. For example, so-called in-situ and ex-situ type treating apparatuses can be used as illustrated in FIGS. 3A and 3B.

Here, an operation of the in-situ type treating apparatus will be explained with reference to FIG. 3A. First of all, a transfer device 44 provided in a transfer module 43 takes an unprocessed semiconductor wafer W from a wafer cassette (not shown) in a load lock 46 using a transfer arm 45, and loads it into a film forming chamber 41. After forming the insulating film in the film forming chamber 41, the transfer device 44 takes the semiconductor wafer W from the film forming chamber 41 using the transfer arm 45, and transfers it into a post-treatment chamber 42. After anneal process by plasma annealing or heat treatment in the post-treatment chamber 42, the transfer device 44 takes the semiconductor wafer W from the post-treatment chamber 42, and transfers it into the film forming chamber 41 again. Afterward, the transfer device 44 repeatedly transfers the semiconductor wafer W between the film forming chamber 41 and the post-treatment chamber 42 alternately until an insulating film with a predetermined thickness is formed. Finally, the transfer device 44 takes the processed semiconductor wafer W from the post-treatment chamber 42, and contains it in the wafer cassette (not shown) in the load lock 46.

In the aforementioned embodiment, the plasma CVD was used in the film forming process. However, the film forming method is not limited to this. Any method may be possible if a uniform thin film with a predetermined thickness can be formed. For example, a substrate is coated with film forming material, thereby making it possible to form a thin film. In other words, this can be applied to a BCB film, an SOG film, and HSQ and MSQ films.

The above embodiment explained that the insulating film was formed on the semiconductor wafer W as a processing object. However, the processing object on which the insulating film is formed is not limited to the semiconductor wafer. For example, the present invention may be applied to process a liquid crystal display substrate.

What is claimed is:

1. A method for forming a porous insulating film having a cyclic siloxane structure, comprising:
    forming an insulating film having the cyclic siloxane structure by generating a plasma of mixed gas of an organic siloxane group compound having the cyclic siloxane structure and an organic compound having a polar group, wherein molecules of the organic compound having the polar group are contained within the cyclic siloxane structure of the insulating film; and
    forming pores by exposing, to excitation gas, the insulating film having the cyclic siloxane structure and removing molecules of the organic compound having the polar group from the insulating film while maintaining the cyclic siloxane structure; wherein
    the insulating film forming and the pore forming are performed alternatively and repeatedly to form the porous insulating film of predetermined thickness.

2. The method according to claim 1, wherein a step of purging is performed between the insulating film forming and the pore forming.

3. The method according to claim 1, wherein the pore forming is performed under a pressure that is lower than that of the insulating film forming.

4. The method of claim 1, wherein the plasma is generated by applying a first power having a first frequency to a lower electrode and applying a second power having a second frequency to an upper electrode, and the first frequency is lower than the second frequency.

5. The method according to claim 1, wherein the insulating film forming is performed under a temperature that is lower than that of the pore forming.

6. The method according to claim 1, wherein the insulating film forming and the pore forming are performed in a same chamber or in separate chambers.

7. A method for forming a porous insulating film having a cyclic siloxane structure, comprising:
    forming an insulating film having the cyclic siloxane structure by supplying an organic siloxane group compound having the cyclic siloxane structure and an organic compound having a polar group to the inside of a process chamber and generating a plasma of mixed gas of the organic siloxane group compound and the organic compound having the polar group, wherein molecules of the organic compound having the polar group are contained within the cyclic siloxane structure of the insulating film; and
    forming pores by generating a plasma of excitation gas within the process chamber and removing the molecules of the organic compound having the polar group from the insulating film while maintaining the cyclic siloxane structure.

8. The method according to claim 7, wherein the insulating film forming and the pore forming are performed alternatively and repeatedly.

9. The method according to claim 7, wherein a step of purging is performed between the insulating film forming and the pore forming.

10. The method according to claim 7, wherein the pore forming is performed under a pressure that is lower than that of said insulating film forming.

11. The method according to claim 7, wherein the plasma is generated by applying a first power having a first frequency to a lower electrode and applying a second power having a second frequency to an upper electrode, and the first frequency is lower than the second frequency.

12. The method according to claim 7, wherein the insulating film forming is performed under a temperature that is lower than that of the pore forming.

13. The method according to claim 7, wherein the insulating film forming and the pore forming are performed in a same chamber or in separate chambers.

* * * * *

UNITED STATES PATENT AND TRADEMARK OFFICE
CERTIFICATE OF CORRECTION

PATENT NO. : 7,601,402 B2
APPLICATION NO. : 10/703092
DATED : October 13, 2009
INVENTOR(S) : Kashiwagi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1276 days.

Signed and Sealed this

Fifth Day of October, 2010

David J. Kappos
*Director of the United States Patent and Trademark Office*